United States Patent
Lin et al.

(10) Patent No.: US 12,261,197 B2
(45) Date of Patent: Mar. 25, 2025

(54) DIFFUSION BARRIER LAYER IN TOP ELECTRODE TO INCREASE BREAK DOWN VOLTAGE

(71) Applicant: Taiwan Semiconductor Manufacturing Company, Ltd., Hsin-Chu (TW)

(72) Inventors: Hsing-Lien Lin, Hsin-Chu (TW); Chii-Ming Wu, Taipei (TW); Hai-Dang Trinh, Hsinchu (TW); Fa-Shen Jiang, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/867,745

(22) Filed: Jul. 19, 2022

(65) Prior Publication Data

US 2022/0367607 A1    Nov. 17, 2022

Related U.S. Application Data

(62) Division of application No. 16/567,247, filed on Sep. 11, 2019, now Pat. No. 11,532,698.

(51) Int. Cl.
*H01L 23/522*    (2006.01)
*H01L 49/02*    (2006.01)

(52) U.S. Cl.
CPC .......... *H01L 28/75* (2013.01); *H01L 23/5223* (2013.01); *H01L 28/91* (2013.01)

(58) Field of Classification Search
CPC ...... H01L 28/75; H01L 28/91; H01L 23/5223
(Continued)

(56) References Cited

U.S. PATENT DOCUMENTS 5,874,355 A * 2/1999 Huang ............. H01L 21/76877
257/E21.585
5,966,613 A    10/1999 Zhao et al.
(Continued)

FOREIGN PATENT DOCUMENTS

CN    103187257    *    7/2013
CN    106558482    *    4/2017
(Continued)

OTHER PUBLICATIONS

Non-Final Office Action dated Feb. 4, 2021 for U.S. Appl. No. 16/567,247.
(Continued)

*Primary Examiner* — Sheng-Bai Zhu
(74) *Attorney, Agent, or Firm* — Eschweiler & Potashnik, LLC

(57) ABSTRACT

Various embodiments of the present disclosure are directed towards a method for forming an integrated chip. The method includes forming a bottom electrode over a substrate. A dielectric layer is formed on the bottom electrode. A first top electrode layer is deposited on the dielectric layer by a first deposition process. A diffusion barrier layer is deposited on the first top electrode layer by a second deposition process different from the first deposition process. A second top electrode layer is deposited on the diffusion barrier layer by a third deposition. The third deposition process is the same as the first deposition process.

20 Claims, 11 Drawing Sheets

(58) Field of Classification Search
USPC .......................................................... 257/532
See application file for complete search history.

(56) References Cited

U.S. PATENT DOCUMENTS

| | | | |
|---|---|---|---|
| 6,365,496 B1* | 4/2002 | Sidhwa | H01L 21/28518 |
| | | | 438/303 |
| 7,150,922 B2 | 12/2006 | Spitsberg et al. | |
| 7,727,882 B1 | 6/2010 | Wu et al. | |
| 2001/0020709 A1 | 9/2001 | Nakao et al. | |
| 2002/0179947 A1 | 12/2002 | Nasu et al. | |
| 2003/0054628 A1* | 3/2003 | Leng | H01L 21/76846 |
| | | | 438/622 |
| 2004/0222493 A1 | 11/2004 | Sato et al. | |
| 2005/0067502 A1* | 3/2005 | Bouic | B05B 7/2408 |
| | | | 239/345 |
| 2006/0017086 A1 | 1/2006 | Kanaya et al. | |
| 2006/0118954 A1* | 6/2006 | Eun | H01L 21/28556 |
| | | | 257/774 |
| 2007/0046142 A1 | 3/2007 | Obara et al. | |
| 2007/0128791 A1* | 6/2007 | Iwaki | H01L 21/82345 |
| | | | 257/296 |
| 2007/0222071 A1 | 9/2007 | Moon | |
| 2007/0296031 A1 | 12/2007 | Tanaka | |
| 2008/0160712 A1* | 7/2008 | Park | H01L 28/56 |
| | | | 361/313 |
| 2008/0251498 A1* | 10/2008 | Chen | H10N 70/826 |
| | | | 216/41 |
| 2008/0251921 A1 | 10/2008 | Besling | |
| 2011/0058305 A1 | 3/2011 | Taki | |
| 2012/0064689 A1 | 3/2012 | Hirota et al. | |
| 2012/0199946 A1 | 8/2012 | Kageyama | |
| 2013/0095652 A1 | 4/2013 | Harada et al. | |
| 2013/0174982 A1* | 7/2013 | Lin | H01L 21/32051 |
| | | | 427/535 |
| 2013/0187110 A1 | 7/2013 | Tendulkar et al. | |
| 2015/0243730 A1* | 8/2015 | Cheng | H01L 21/76841 |
| | | | 438/653 |
| 2017/0141300 A1 | 5/2017 | Trinh et al. | |
| 2017/0330931 A1 | 11/2017 | Cheng et al. | |
| 2018/0342518 A1 | 11/2018 | Kim | |

FOREIGN PATENT DOCUMENTS

| | | | |
|---|---|---|---|
| DE | 102007040283 | * | 2/2009 |
| JP | H06151356 | * | 5/1994 |
| JP | H08111420 | * | 4/1996 |
| JP | H09251943 | * | 9/1997 |
| KR | 19980078609 | * | 11/1998 |
| KR | 100248988 | * | 3/2000 |
| KR | 20050067502 | * | 7/2005 |
| KR | 20060000906 | * | 1/2006 |
| KR | 20060041352 | * | 5/2006 |
| KR | 20060041355 | * | 5/2006 |

OTHER PUBLICATIONS

Final Office Action dated May 13, 2021 for U.S. Appl. No. 16/567,247.
Non-Final Office Action dated Sep. 17, 2021 for U.S. Appl. No. 16/567,247.
Final Office Action dated Dec. 24, 2021 for U.S. Appl. No. 16/567,247.
Non-Final Office Action dated May 26, 2022 for U.S. Appl. No. 16/567,247.

* cited by examiner

DIFFUSION BARRIER LAYER IN TOP ELECTRODE TO INCREASE BREAK DOWN VOLTAGE

REFERENCE TO RELATED APPLICATION

This Application is a Divisional of U.S. application Ser. No. 16/567,247, filed on Sep. 11, 2019, the contents of which are hereby incorporated by reference in their entirety.

BACKGROUND

Modern day integrated chips comprise millions or billions of transistor devices, which are configured to enable logical functionality for an integrated chip (e.g., form a processor configured to perform logic functions). Often integrated chips may also comprise passive devices, such as capacitors, resistors, inductors, varactors, etc. Metal-insulator-metal (MIM) capacitors are a common type of passive device that is often integrated into the back-end-of-the-line metal interconnect layers of integrated chips. For example, MIM capacitors may be used as decoupling capacitors configured to mitigate power supply or switching noise (e.g., switching of input/output (I/O) and core circuits) caused by changes in current flowing through various parasitic inductances associated with an integrated chip and a package in which the integrated chip is located.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
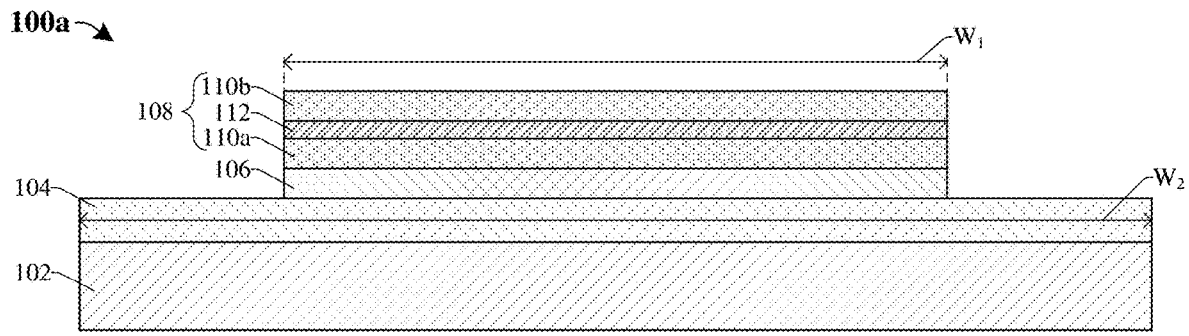
FIGS. 1A-1C illustrate cross-sectional views of some embodiments of a metal-insulator-metal (MIM) capacitor having a diffusion barrier layer.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

MIM (metal-insulator-metal) capacitors may be implemented into the back-end-of-the-line (BEOL) metal interconnect layers of integrated chips. MIM capacitors typically have a top electrode and a bottom electrode separated by a capacitor dielectric layer. During formation of a MIM capacitor, a capacitor dielectric layer is formed over a bottom electrode. A top electrode film is deposited over the capacitor dielectric layer. A masking layer is formed over the top electrode film, and the top electrode film is patterned according to the masking layer, thereby forming a top electrode. A masking layer removal process is performed to remove the masking layer and a cleaning process is performed to remove by-products from the top electrode film deposition and/or the patterning process. The removal and/or cleaning processes utilize one or more chemicals from a diffusive species (e.g., oxygen ($O_2$), hydrogen peroxide ($H_2O_2$), hydrofluoric acid (HF), dihydrofolic acid (DHF), etc.).

A challenge with the above MIM capacitor pertains to a structure of the top electrode. The top electrode film may be formed by a physical vapor deposition (PVD) process with a large thickness (e.g., 400 Angstroms), such that the top electrode has large columnar grains. The large thickness increases a structural integrity of the MIM capacitor but does so at the expense of large grain sizes. Due to the columnar grains, the diffusive species from the removal and/or cleaning processes diffuses through the top electrode (e.g., along the grain boundaries between adjacent columnar grains) to the capacitor dielectric layer. The diffusive species reacts or otherwise interacts with the capacitor dielectric layer, thereby forming voids in the capacitor dielectric layer.

These voids may result in electrical breakdown of the capacitor dielectric layer, and may hence result in the top electrode electrically shorting to the bottom electrode at high operating voltages (e.g., within a range of 2.3 to 3.5 volts (V)). Such electrical shorting, in turn, leads to failure of the MIM capacitor.

Various embodiments of the present application are directed to a top electrode having a diffusion barrier layer that blocks and/or prevents the diffusion of the diffusive species. In some embodiments, a first top electrode layer is formed over the capacitor dielectric layer by a PVD process, such that the first top electrode layer comprises a first material (e.g., titanium nitride (TiN)) that has columnar grains and a first thickness (e.g., 200 Angstroms). A diffusion barrier layer is formed over the first top electrode layer by an atomic layer deposition (ALD) process, and an annealing process with a treatment species (e.g., nitrogen ($N_2$), hydrogen ($H_2$), a combination of the foregoing, etc.) is performed on the diffusion barrier layer. The diffusion barrier layer comprises the first material with a second thickness (e.g., 10 to 15 Angstroms). By virtue of performing the annealing process with the treatment species, the diffusion barrier layer is nitrogen rich (e.g., N-rich) and has a higher ratio of nitrogen atoms to titanium atoms than the first top electrode layer. This results in the diffusion barrier layer being at least partially crystalline with grain sizes smaller than the columnar grains of the first top electrode layer. A second top electrode layer is formed over the diffusion barrier layer by a PVD process, such that the second top electrode layer comprises the first material with columnar grains and has about the first thickness (e.g., 200 Angstroms). The aforementioned layers are patterned according to a masking layer, thereby defining the top electrode. The partially crystalline structure and small grain sizes of the diffusion barrier layer blocks diffusion of the diffusive species to the capacitor dielectric layer during subsequent removal and/or cleaning processes. Thus, the diffusion barrier layer prevents the formation of voids in the capacitor dielectric layer, thereby preventing the breakdown in the MIM capacitor at high operating volts. This, in part, increases an operating voltage, an endurance, and a reliability of the MIM capacitor.

Referring to FIG. 1A, a cross-sectional view of some embodiments of a metal-insulator-metal (MIM) capacitor 100a having a diffusion barrier layer 112 is provided.

The MIM capacitor 100a includes a top electrode 108, a bottom electrode 104, and a capacitor dielectric layer 106 disposed between the top and bottom electrodes 108,104. The bottom electrode 104 overlies a substrate 102. The top electrode 108 overlies the bottom electrode 104, and has a first width $W_1$ that is smaller than a second width $W_2$ of the bottom electrode 104. The top electrode 108 includes a first top electrode layer 110a, a second top electrode layer 110b, and a diffusion barrier layer 112 disposed between the first and second top electrode layers 110a-b.

In some embodiments, the top electrode 108 and the bottom electrode 104 may be or comprise a metal nitride, such as, for example, titanium nitride, tantalum nitride, tungsten nitride, or the like. The first and second top electrode layers 110a-b comprise the metal nitride with a first ratio of nitrogen atoms to metal atoms (e.g., titanium atoms), such that the aforementioned layers have grains (e.g., columnar grains) with a first grain size. The diffusion barrier layer 112 comprises a metal nitride with a second ratio of nitrogen atoms to metal atoms (e.g., titanium atoms), such that the diffusion barrier layer has diffusion barrier grains (e.g., non-columnar grains) with a second grain size smaller than the first grain size. In some embodiments, the first ratio of nitrogen atoms to metal atoms is 1:1 and the second ratio of nitrogen atoms to metal atoms is 1.0x:1 (where x is within a range of about 2-5). For example, for every 100 metal atoms the first and/or second top electrode layers 110a-b may comprise 100 nitrogen atoms, whereas for every 100 metal atoms the diffusion barrier layer 112 may comprise 102 to 105 nitrogen atoms. Therefore, the diffusion barrier layer 112 is nitrogen rich (N-rich) (i.e., a greater number of nitrogen atoms than metal atoms). By virtue of the nitrogen atoms having a smaller atomic radius than the metal atoms, a distance between atoms in the diffusion barrier layer 112 is less than a distance between atoms in the first and/or second top electrode layers 110a-b. Thus, the atoms in the diffusion barrier layer 112 are more densely packed together than the atoms in the first and/or second top electrode layers 110a-b, leading to the diffusion barrier layer 112 having smaller grain sizes. In some embodiments, the atoms in the diffusion barrier layer 112 are so densely packed together that a diffusive species (e.g., oxygen ($O_2$), hydrogen peroxide ($H_2O_2$), hydrofluoric acid (HF), dihydrofolic acid (DHF), etc.) is unable to travel between adjacent atoms in the diffusion barrier layer 112. Therefore, the diffusion barrier layer 112 has more densely packed atoms, non-columnar grains, and/or an at least partially crystalline structure that contributes to an ability to block and/or mitigate diffusion of the diffusive species. This prevents the diffusive species from adversely affecting a structural integrity of the capacitor dielectric layer 106, thereby mitigating degradation of the MIM capacitor 100a. In some embodiments, the bottom electrode 104 comprises a metal nitride with the first ratio of nitrogen atoms to metal atoms, wherein the bottom electrode 104 has columnar grains.

For example, during a formation of the MIM capacitor 100a, the first top electrode layer 110a is formed over the capacitor dielectric layer 106 by a first deposition process (e.g., a physical vapor deposition (PVD) process). By virtue of the first deposition, the first top electrode layer 110a has first grain sizes (e.g., columnar grains). The diffusion barrier layer 112 is formed over the first top electrode layer 110a by a second deposition process (e.g., an atomic layer deposition (ALD) process) with a second thickness (e.g., about 10-15 Angstroms). After performing the second deposition process, an annealing process with a treatment species (e.g., nitrogen ($N_2$), hydrogen ($H_2$), a combination of the foregoing, etc.) is performed on the diffusion barrier layer 112, such that the diffusion barrier layer is rich in the treatment species (e.g., N-rich). In some embodiments, the annealing process is performed with a first treatment species (e.g., nitrogen ($N_2$)) and a second treatment species (e.g., hydrogen ($H_2$)), where the second treatment species facilitates implanting the first treatment species into the diffusion barrier layer. In such embodiments, the second treatment species may facilitate dissociating a molecule of the first treatment species into first treatment species atoms, such that the first treatment species atoms may be more easily implanted into the diffusion barrier layer 112. This ensures the diffusion barrier layer 112 has second grain sizes (e.g., equiaxed gains) smaller than the first grain sizes. Further, the second top electrode layer 110b is formed over the diffusion barrier layer 112 by the first deposition process, such that the second top electrode layer 110b has the first grain sizes. After forming the aforementioned layers, a patterning process is performed, thereby defining the top electrode 108 with the first width $W_1$. Subsequently, a removal process may be performed to remove a mask (e.g., a photoresist mask) and/or a cleaning process may be performed to remove by-products from the aforementioned deposition processes and/or the patterning process.

The removal and/or cleaning processes utilize one or more chemicals from the diffusive species (e.g., oxygen ($O_2$), hydrogen peroxide ($H_2O_2$), hydrofluoric acid (HF), etc.). In some embodiments, if the diffusive species reaches the capacitor dielectric layer 106 it may react or otherwise interact with the capacitor dielectric layer 106, thereby forming voids in the capacitor dielectric layer 106. During the removal and/or cleaning processes, the diffusive species may travel along grain boundaries of the grains in the second top electrode layer 110b to the diffusion barrier layer 112. However, the second grain sizes of the diffusion barrier layer 112 mitigate and/or block the diffusive species from reaching the capacitor dielectric layer 106. Thus, the second grain sizes of the diffusion barrier layer 112 prevent the formation of voids in the capacitor dielectric layer 106. By preventing the formation of voids in the capacitor dielectric layer 106, breakdown of the capacitor dielectric layer 106 may not occur under high operating voltages (e.g., within a range of 2.3 to 3.5 V). Therefore, the diffusion barrier layer 112 increases an operating voltage (e.g., up to about 4.8 V), an endurance, and a reliability of the MIM capacitor 100a.

Figure 1B:
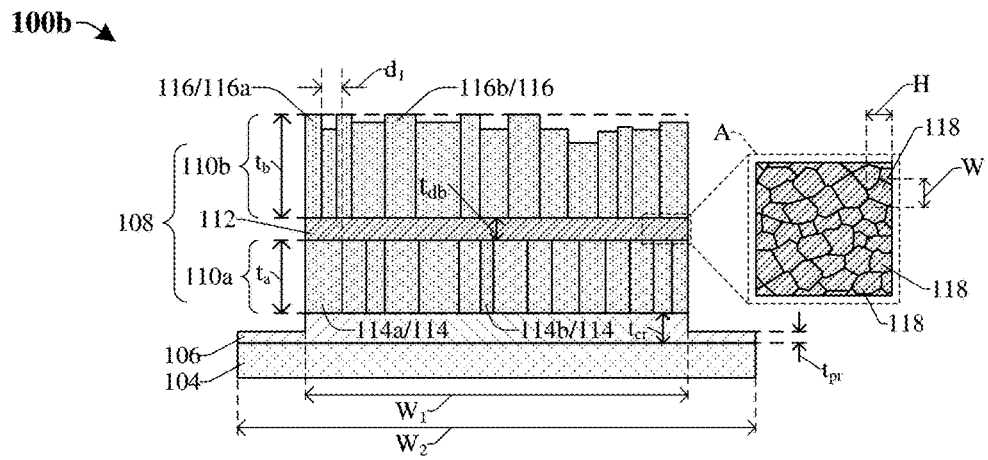

Referring to FIG. 1B, a cross-sectional view of a MIM capacitor 100b according to some alternative embodiments of the MIM capacitor 100a of FIG. 1A is provided. In some embodiments, the cross-sectional view of the MIM capacitor 100b in FIG. 1B is an enlarged view, such that the grain sizes of the different layers are visible.

The capacitor dielectric layer 106 has a thickness $t_{cr}$ defined in a center region of the capacitor dielectric layer 106. The top electrode 108 overlies the center region of the capacitor dielectric layer 106, such that the capacitor dielectric layer 106 has the thickness $t_{cr}$ between a top surface of the bottom electrode 104 and a bottom surface of the first top electrode layer 110a. The capacitor dielectric layer 106 has a thickness $t_{pr}$ defined in a peripheral region of the capacitor dielectric layer 106, such that the peripheral region surrounds the center region and is laterally offset from the top electrode 108. In some embodiments, the thickness $t_{pr}$ is less than the thickness $t_{cr}$. Thus, the capacitor dielectric layer 106 has two discrete thicknesses. In some embodiments, the capacitor dielectric layer 106 may, for example, be or comprise a high κ dielectric material, such as aluminum oxide ($Al_xO_y$), zirconium oxide ($ZrO_x$), or the like. As used herein, a high κ dielectric material is a dielectric material with a dielectric constant greater than 3.9. In yet further embodiments, the capacitor dielectric layer 106 comprises a plurality of dielectric materials and/or a plurality of dielectric layers. For example, the capacitor dielectric layer 106 may comprise a first zirconium oxide layer (e.g., $ZrO_2$), a second zirconium oxide layer (e.g., $ZrO_2$), and an aluminum oxide layer (e.g., $Al_2O_3$) disposed between the first and second zirconium oxide layers (not shown).

The first top electrode layer 110a comprises a plurality of grains 114. For ease of illustration, only some of the grains 114 are labeled 114. The grains 114 define grain boundaries that may extend from an upper surface of the capacitor dielectric layer 106 to a lower surface of the diffusion barrier layer 112. In some embodiments, the grains 114 are columnar grains, and a first grain may have a different area and/or width than a second grain. For example, a first grain 114a may have a greater width and/or area than a second grain 114b. In some embodiments, the first top electrode layer 110a may, for example, be or comprise a first material, such as titanium nitride, tantalum nitride, tungsten nitride, or the like and/or may have a maximum thickness $t_a$ of about 100 Angstroms, 200 Angstroms, or within a range of about 100 to 200 Angstroms.

The second top electrode layer 110b comprises a plurality of grains 116. For ease of illustration, only some of the grains 116 are labeled 116. The grains 116 define grain boundaries that may extend from an upper surface of the diffusion barrier layer 112 to a point above the upper surface of the diffusion barrier layer 112. In some embodiments, the grains 116 are columnar grains, and a first grain may have a different area and/or width than a second grain. For example, a first grain 116a may have a greater width and/or area than a second grain 116b. In some embodiments, a grain boundary of the first grain 116a of the second top electrode layer 110b is laterally offset from a grain boundary of the first grain 114a of the first top electrode layer 110a by a distance $d_1$. In some embodiments, the distance $d_1$ is non-zero. Thus, the grains 116 of the second top electrode layer 110b and the grains 114 of the first top electrode layer 110a may both be columnar grains with different layouts and/or different grain boundary locations. In such embodiments, the distance $d_1$ being non-zero increases an ability for the top electrode 108 to prevent diffusion of the diffusive species to the capacitor dielectric layer 106. The distance $d_1$ may act as another barrier in place of the diffusive species. For example, in some embodiments, the diffusive species may vertically diffuse through the first top electrode layer 110a and the diffusion barrier layer 112. In such embodiments, the shifted grain boundaries (e.g., due to the distance $d_1$) between the first and second top electrode layers 110a-b may require the diffusive species to laterally diffuse before it could vertically diffuse through the second top electrode layer 110b. Thus, the shifted grain boundaries between the first and second electrode layers 110a-b increase an ability to mitigate and/or block diffusion of the diffusive species.

In some embodiments the second top electrode layer 110b comprises the first material, such that the first and second top electrode layers 110a-b comprise a same material. In some embodiments, the second top electrode layer 110b may, for example, be or comprise titanium nitride, tantalum nitride, tungsten nitride, or the like and/or may have a maximum thickness $t_b$ of about 100 Angstroms, 200 Angstroms, or within a range of about 100 to 200 Angstroms. In some embodiments, the maximum thickness $t_a$ of the first top electrode layer 110a is equal to the maximum thickness $t_b$ of the second top electrode layer 110b.

The diffusion barrier layer 112 is between the first and second top electrode layers 110a-b and has diffusion barrier grains 118. Box A illustrates an enlarged view of the diffusion barrier layer 112, such that the diffusion barrier grains 118 may be more easily illustrated. In some embodiments, an entirety of the diffusion barrier layer 112 comprises the diffusion barrier grains 118. For ease of illustration, only some of the diffusion barrier grains 118 are labeled 118. In some embodiments, the diffusion barrier grains 118 are smaller than the grains 114 of the first top electrode layer 110a and/or the grains 116 of the second top electrode layer 110b. The diffusion barrier grains 118 may, for example, be equiaxed grains and/or non-columnar grains. In further embodiments, the diffusion barrier layer 112 may have a partially crystalline structure. In the aforementioned embodiments, the diffusion barrier grains 118 have a grain size smaller than the grains 114 of the first top electrode layer 110a and/or the grains 116 of the second top electrode layer 110b.

The smaller grain sizes of the diffusion barrier grains 118 (in relation to the grains 116) allow the diffusion barrier grains 118 to be more densely packed together, hence the diffusion barrier grains 118 have smaller grain boundaries than the grains 116. In some embodiments, the grain sizes are small enough to block and/or mitigate diffusion of the diffusive species. Therefore, the diffusion barrier layer 112 is configured to block and/or mitigate diffusion of a diffusive species to the capacitor dielectric layer 106. The diffusive species may, for example, be or comprise oxygen ($O_2$), hydrogen peroxide ($H_2O_2$), hydrofluoric acid (HF), dihydrofolic acid (DHF), a combination of the aforementioned, or the like. In some embodiments, the diffusive species may travel along the grain boundaries of the grains 116 of the second top electrode layer 110b to the diffusion barrier layer 112. However, the diffusive species may be unable to enter the diffusion barrier layer 112 and/or travel along grain boundaries of the diffusion barrier grains 118. Thus, the diffusion barrier layer 112 blocks the diffusive species from reaching the capacitor dielectric layer 106. In further embodiments, the diffusion barrier layer 112 comprises titanium nitride with a higher concentration of nitrogen than titanium.

The diffusion barrier layer 112 has a thickness $t_{db}$ that is smaller than the maximum thickness $t_a$ of the first top electrode layer 110a and/or the maximum thickness $t_b$ of the second top electrode layer 110b. For example, the thickness $t_{bd}$ is within a range of about 10 to 15 Angstroms. In some embodiments, if the thickness $t_{bd}$ is less than 10 Angstroms, then the diffusion barrier layer 112 may be unable to block diffusion of the diffusive species, thereby resulting in breakdown of the capacitor dielectric layer 106 under high operating voltages (e.g., within a range of 2.3 to 3.5 V). In yet another embodiment, if the thickness $t_{bd}$ is greater than 15 Angstroms, then time and costs associated with forming the diffusion barrier layer 112 may be increased. The first top electrode layer 110a, the second top electrode layer 110b, and the diffusion barrier layer 112 may comprise a same material (e.g., TiN). In some embodiments, the diffusion barrier layer 112 may, for example, be or comprise titanium nitride, tantalum nitride, tungsten nitride, tungsten, nickel, titanium, tantalum, zirconium, nickel chromium, palladium, or the like. In some embodiments, a maximum thickness of the diffusion barrier layer 112 is about 20, 15, 13, or within a range of 10-20 times less than a maximum thickness $t_a$ of the first top electrode layer 110a and/or a maximum thickness $t_b$ of the second top electrode layer 110b.

In some embodiments, the diffusion barrier grains 118 are small grains with approximately equal dimensions. In some embodiments, a diffusion barrier grain 118 has approximately equal dimensions if all dimensions of the diffusion barrier grains 118 (e.g., height H, width W, and depth D) are within about 30, 20, or 10 percent of the average of the dimensions (e.g., (H+W+D)/3). In some embodiments, one, some, or all of the dimensions of the diffusion barrier grains 118 is/are between about 1-4.5 nanometers, about 2.5-4.5 nanometers, or about 0.5-2.5 nanometers. For example, a maximum dimension of the diffusion barrier grains 118 may be between one of these ranges. Further, in some embodiments, one (e.g., a maximum dimension), some, or all of the dimensions of the diffusion barrier grains 118 is/are less than about 4 or 4.5 nanometers. For example, a maximum dimension of the diffusion barrier grains 118 may be less than one or more of these thresholds.

Figure 1C:
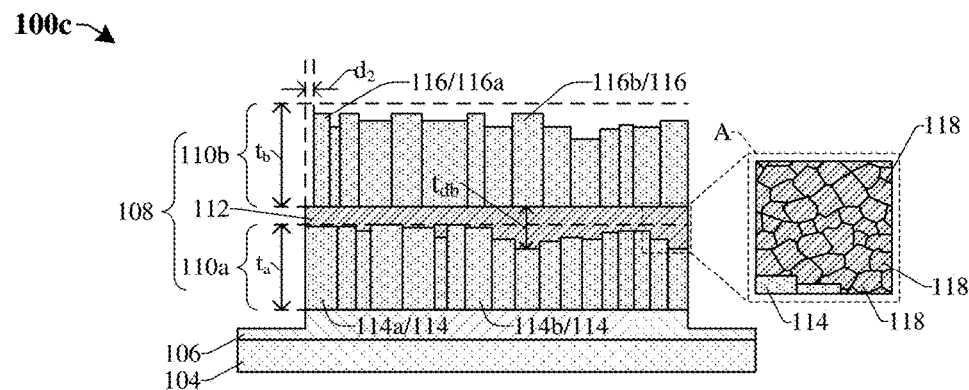

Referring to FIG. 1C, a cross-sectional view of a MIM capacitor 100c according to some alternative embodiments of the MIM capacitor 100b of FIG. 1B is provided. The diffusion barrier layer 112 has a rough bottom surface that conforms to a rough upper surface of the first top electrode layer 110a. In some embodiments, the upper surface of the first top electrode layer 110a comprises a plurality of protrusions and the bottom surface of the diffusion barrier layer 112 comprises a plurality of recesses that adjoin the protrusions of the first top electrode layer 110a. Further, a sidewall of the second top electrode layer 110b is laterally offset from a sidewall of the diffusion barrier layer 112 by a distance $d_2$. In some embodiments, the distance $d_2$ is non-zero.

Figure 2A:
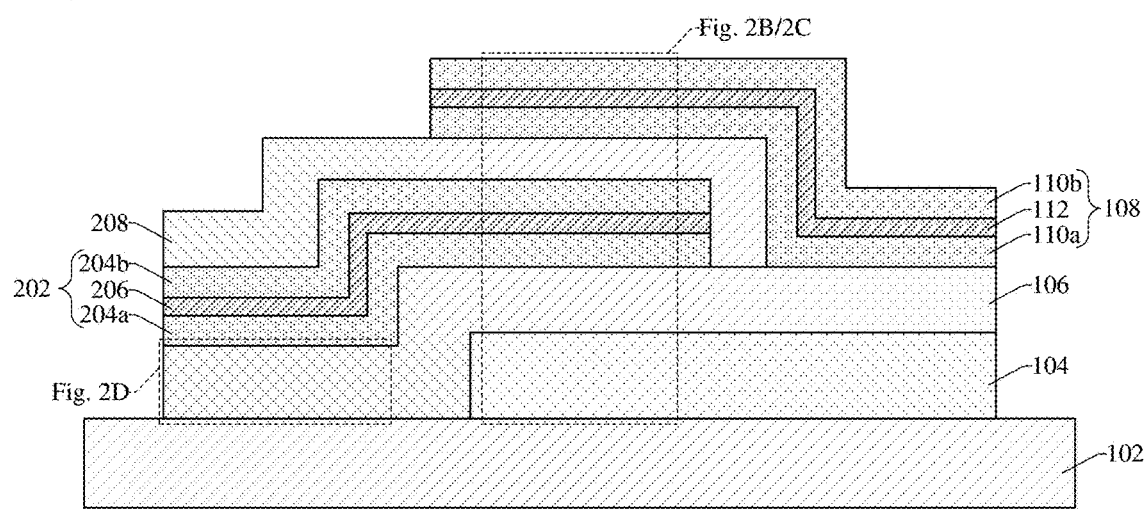
FIG. 2A illustrates a cross-sectional view of some embodiments of a metal-insulator-metal-insulator-metal (MIMIM) capacitor having multiple diffusion barrier layers.

Referring to FIG. 2A, a cross-sectional view of some embodiments of a metal-insulator-metal-insulator-metal (MIMIM) capacitor 200a including a top electrode 108 with a diffusion barrier layer 112 and a middle electrode 202 comprising a middle electrode diffusion barrier layer 206 is provided.

A bottom electrode 104 overlies a substrate 102. A capacitor dielectric layer 106 overlies the substrate 102 and the bottom electrode 104. The capacitor dielectric layer 106 continuously extends over a sidewall and an upper surface of the bottom electrode 104. A middle electrode 202 extends over an upper surface of the capacitor dielectric layer 106 and overlies a portion of the bottom electrode 104. The middle electrode 202 is separated from the bottom electrode 104 by the capacitor dielectric layer 106.

The middle electrode 202 comprises a first middle electrode layer 204a, a second middle electrode layer 204b, and a middle electrode diffusion barrier layer 206 disposed between the first and second middle electrode layers 204a-b. In some embodiments, the middle electrode 202 is configured as the top electrode 108 of FIGS. 1A-1C, such that the middle electrode diffusion barrier layer 206 is configured to block and/or mitigate diffusion of a diffusive species (e.g., oxygen ($O_2$), hydrogen peroxide ($H_2O_2$), hydrofluoric acid (HF), etc.) to the capacitor dielectric layer 106. Further, the first and second middle electrode layers 204a-b may each have columnar grains and the middle electrode diffusion barrier layer 206 has grains smaller than the columnar grains. In further embodiments, the middle electrode diffusion barrier layer 206 comprises titanium nitride with a high concentration of nitrogen, such that the middle electrode diffusion barrier layer 206 is at least partially crystalline. In the aforementioned embodiment, the at least partially crystalline structure of the middle electrode diffusion barrier layer 206 blocks and/or mitigates diffusion of the diffusive species. In yet further embodiments, the middle electrode diffusion barrier layer 206 comprises equiaxed grains.

An upper capacitor dielectric layer 208 overlies an upper surface of the middle electrode 202. In some embodiments, the upper capacitor dielectric layer 208 comprises a same material as the capacitor dielectric layer 106. In some embodiments, the upper capacitor dielectric layer 208 may, for example, be or comprise a high κ dielectric material, such as aluminum oxide ($Al_xO_y$), zirconium oxide ($ZrO_x$), or the like. In yet further embodiments, the upper capacitor dielectric layer 208 comprises a plurality of dielectric materials and/or a plurality of dielectric layers. For example, the upper capacitor dielectric layer 208 may comprise a first zirconium oxide layer (e.g., $ZrO_2$), a second zirconium oxide layer (e.g., $ZrO_2$), and an aluminum oxide layer (e.g., $Al_2O_3$) disposed between the first and second zirconium oxide layers (not shown).

The top electrode 108 overlies the upper capacitor dielectric layer 208 and the capacitor dielectric layer 106. The top electrode 108 is configured as the top electrode 108 of FIGS. 1A-1C, such that the diffusion barrier layer 112 is disposed between the first and second top electrode layers 110a-b. The diffusion barrier layer 112 is configured to block and/or mitigate diffusion of the diffusive species to the upper capacitor dielectric layer 208 and/or the capacitor dielectric layer 106. In some embodiments, the top electrode 108 is separated from the middle electrode 202 by the upper capacitor dielectric layer 208, and the top electrode 108 is separated from the middle electrode by the capacitor dielectric layer 106.

Figure 2B:
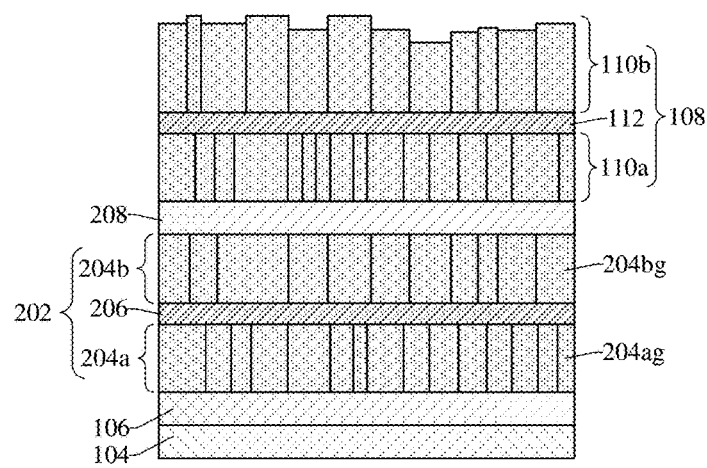
FIGS. 2B-2D illustrate cross-sectional views of alternative embodiments of a section of the MIMIM capacitor of FIG. 2A as indicated by the dashed boxes in FIG. 2A.

Referring to FIG. 2B, a cross-sectional view 200b of a portion of the MIMIM capacitor 200a of FIG. 2A as indicated by the dashed box in FIG. 2A is provided.

The first middle electrode layer 204a comprises a plurality of grains 204ag that may, for example, be columnar grains that create grain boundaries extending from the capacitor dielectric layer 106 to the middle electrode diffusion barrier layer 206. The second middle electrode layer 204b comprises a plurality of grains 204bg that may, for example, be columnar grains that create grain boundaries extending from the middle electrode diffusion barrier layer 206 to the upper capacitor dielectric layer 208. The middle electrode diffusion barrier layer 206 may, for example, comprises diffusion barrier grains (not shown) that are smaller than the grains 204ag and/or the grains 204bg. In some embodiments, the diffusion barrier grains of the middle electrode diffusion barrier layer 206 may be configured as the diffusion barrier grains 118 of FIG. 1B. The top electrode 108 overlies the upper capacitor dielectric layer 208 and is configured as the top electrode 108 of FIGS. 1A-C.

Figure 2C:
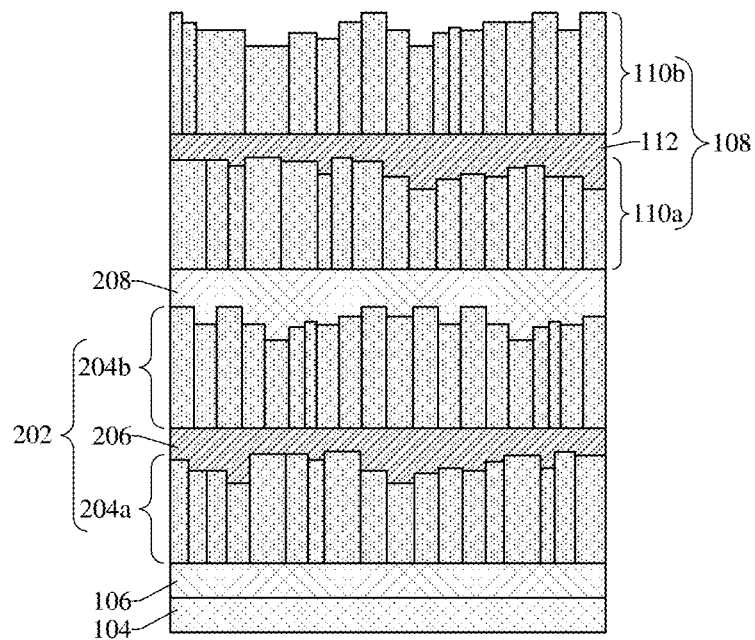

Referring to FIG. 2C, a cross-sectional view 200c of an alternative embodiment of FIG. 2B is provided, in which the first middle electrode layer 204a comprises a plurality of protrusions that adjoin a plurality of recesses of the middle electrode diffusion barrier layer 206. The second middle electrode layer 204b comprises a plurality of protrusions that adjoin a plurality of recesses of the upper capacitor dielectric layer 208. Further, the first top electrode layer 110a comprises a plurality of protrusions that adjoin a plurality of recesses of the diffusion barrier layer 112.

Figure 2D:
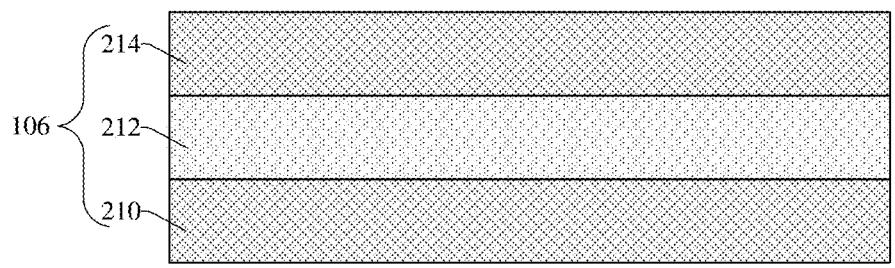

Referring to FIG. 2D, a cross-sectional view 200d of a portion of the MIMIM capacitor 200a of FIG. 2A as indicated by the dashed box in FIG. 2A is provided, in which the capacitor dielectric layer 106 comprises a lower dielectric layer 210, a middle dielectric layer 212, and an upper dielectric layer 214. The middle dielectric layer 212 is disposed between the upper and lower dielectric layers 214, 210. In some embodiments, the upper and lower dielectric layers 214, 210 may respectively comprise zirconium oxide and the middle dielectric layer 212 may comprise aluminum oxide. In further embodiments, the upper capacitor dielectric layer 208 is configured as the capacitor dielectric layer 106 in FIG. 2D (not shown).

Figure 3:
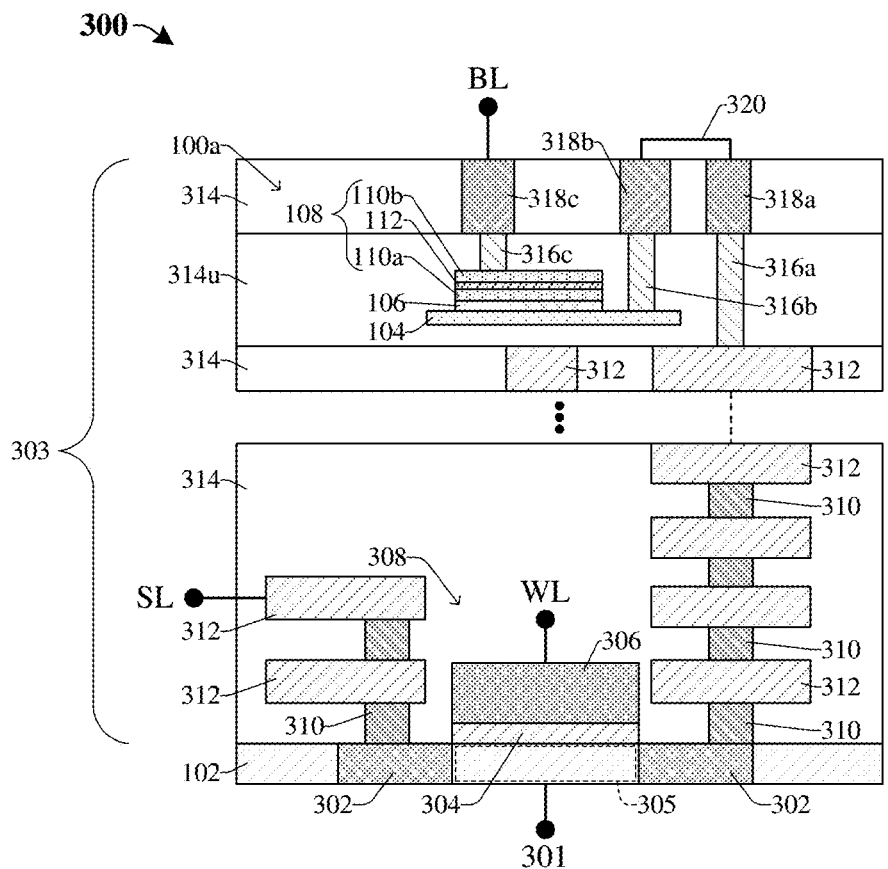
FIG. 3 illustrates a cross-sectional view of an integrated circuit (IC) including a MIM capacitor disposed in an interconnect structure.

Referring to FIG. 3, a cross-sectional view of some embodiments of an integrated circuit (IC) 300 including a metal-insulator-metal (MIM) capacitor 100a is provided. The MIM capacitor 100a is disposed in an interconnect structure 303 configured for a one-transistor one-capacitor (1T1C) setup.

The IC 300 includes the interconnect structure 303 overlying a substrate 102. The substrate 102 may, for example, be or comprise a bulk substrate (e.g., a bulk silicon substrate) or a silicon-on-insulator (SOI) substrate. An access metal-oxide-semiconductor field-effect transistor (MOSFET) 308 is disposed on the substrate 102. The access MOSFET 308 includes a pair of source/drain regions 302 disposed in the substrate 102 and laterally spaced apart. A gate dielectric 304 overlies the substrate 102 between the individual source/drain regions 302, and a gate electrode 306 overlies the gate dielectric 304. In some embodiments, the gate electrode 306 may, for example, be or comprise polysilicon, or another suitable conductive material. The substrate 102 comprises a first doping type (e.g., p-type) and the source/drain regions 302 comprise a second doping type (e.g., n-type) opposite the first doping type. In some embodiments, the source/drain regions 302 comprise a doping concentration greater than a doping concentration of the substrate 102. A well region 305 is disposed between the source/drain regions 302 and comprises the first doping type with a higher doping concentration than the substrate 102.

The interconnect structure 303 comprises a plurality of inter-level dielectric (ILD) layers 314 overlying the substrate 102 and the access MOSFET 308. The ILD layers 314 may comprise one or more ILD materials. In some embodiments, the one or more ILD materials may, for example be a low κ dielectric material, an oxide (e.g., silicon dioxide), a combination of the aforementioned, or another suitable dielectric material. As used herein, a low κ dielectric material is a dielectric material with a dielectric constant less than 3.9. A plurality of conductive wires 312 and conductive vias 310 are stacked within the ILD layers 314 and are configured to provide electrical connections between various devices (e.g., the access MOSFET 308 and/or the MIM capacitor 100a) disposed throughout the IC 300. In some embodiments, the conductive wires 312 and/or the conductive vias 310 may, for example, be or comprise copper, aluminum, or some other conductive material.

The MIM capacitor 100a is disposed in an upper ILD layer 314u. The MIM capacitor 100a includes a top electrode 108, a bottom electrode 104, and a capacitor dielectric layer 106 disposed between the top and bottom electrodes 108, 104. A plurality of upper vias 316a-c electrically couple the MIM capacitor 100a to the underlying conductive wires 312. The plurality of upper vias 316a-c are electrically coupled to upper wires 318a-c. In some embodiments, a first upper wire 318a is electrically coupled to a second upper wire 318b by way of a connector 320 (which is schematically illustrated for each of illustration). In some embodiments, the connector 320 comprises wires and/or vias overlying the MIM capacitor 100a. A bottom electrode via 316b extends from the second upper wire 318b to a bottom electrode 104 of the MIM capacitor 100a and a top electrode via 316c extends from a third upper wire 318c to the top electrode 108 of the MIM capacitor 100a. In some embodiments, the MIM capacitor 100a is configured as the MIM capacitor 100a of FIGS. 1A-C.

In some embodiments, the gate electrode 306 is electrically coupled to a word line (WL), such that an appropriate WL voltage can be applied to the gate electrode 306 to electrically couple the MIM capacitor 100a to a bit line (BL) and source line (SL). The SL is electrically coupled to a source/drain region 302 and the BL is electrically coupled to another source/drain region 302 by way of the interconnect structure 303 and the MIM capacitor 100a. Thus, in some embodiments, an output of the BL and/or the MIM capacitor 100a may be accessed at the SL upon application of the appropriate WL voltage. In further embodiments, a voltage may be applied at a transistor body node 301 that is electrically coupled to the well region 305 (i.e., a body of the access MOSFET 308) disposed under the gate electrode 306. The voltage applied at the transistor body node 301 may be configured to assist in controlling a conductive channel formed in the well region 305.

Figure 4:
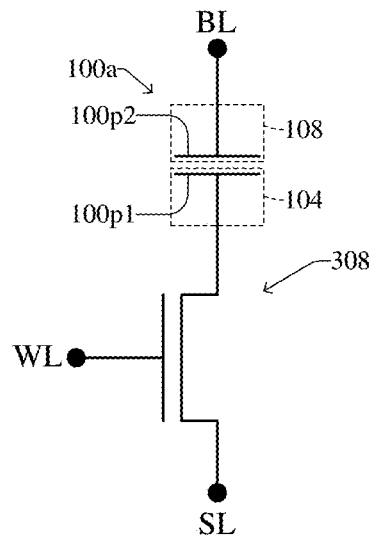
FIG. 4 illustrates a circuit diagram of some embodiments of the IC of FIG. 3.

Referring to FIG. 4, a circuit diagram 400 of some embodiments of the IC 300 of FIG. 3 is provided.

As illustrated in FIG. 4, the SL is electrically coupled to a first source/drain region of the access MOSFET 308. A WL is electrically coupled to a gate electrode of the access MOSFET 308, and a second source/drain region of the access MOSFET 308 is electrically coupled to the MIM capacitor 100*a*. The bottom electrode 104 is configured as a first plate 100*p*1 of the MIM capacitor 100*a*, and the top electrode 108 is configured as a second plate 100*p*2 of the MIM capacitor 100*a*, such that the first plate 100*p*1 is parallel to the second plate 100*p*2. In some embodiments, the capacitor dielectric layer (106 of FIG. 3) is disposed between the first and second plates 100*p*1, 100*p*2. In some embodiments, the first plate 100*p*1 is electrically coupled to the second source/drain region of the access MOSFET 308, and the second plate 100 *p*2 is electrically coupled to a BL.

Figure 5:
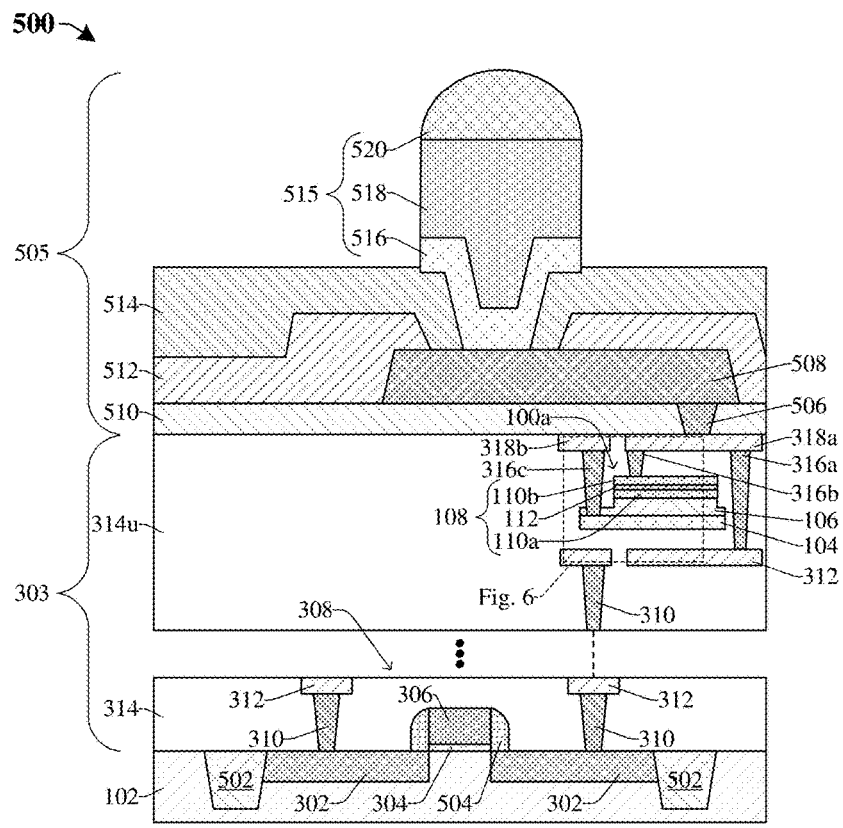
FIG. 5 illustrates a cross-sectional view of some alternative embodiments of the IC of FIG. 3, in which a bonding structure overlies the interconnect structure.

Referring to FIG. 5, a cross-sectional view of an IC 500 according to some alternative embodiments of the IC 300 of FIG. 3 is provided, in which a bonding structure 505 overlies the interconnect structure 303.

The access MOSFET 308 includes source/drain regions 302, a gate electrode 306, and a gate dielectric 304. The source/drain regions 302 are disposed between an isolation structure 502 that extends from an upper surface of the substrate 102 to a point below the upper surface of the substrate 102. In some embodiments, the isolation structure 502 is configured as a shallow trench isolation (STI) structure and comprises one or more dielectric materials (e.g., silicon dioxide). The access MOSFET 308 further includes a sidewall spacer structure 504 surrounding the gate electrode 306 and the gate dielectric 304. At least a portion of the sidewall spacer structure 504 overlies the source/drain regions 302.

The bonding structure 505 overlies the interconnect structure 303 and the MIM capacitor 100*a*. The bonding structure 505 includes a first passivation layer 510, a second passivation layer 512, a top dielectric structure 514, a bump structure 515, a redistribution layer 508, and a redistribution via 506. The redistribution layer 508 is disposed within the second passivation layer 512. The redistribution via 506 is disposed within the first passivation layer 510 and extends from the redistribution layer 508 to a first upper wire 318*a*. Thus, the redistribution layer 508 is electrically coupled to the MIM capacitor 100*a*. The bump structure 515 extends through the top dielectric structure 514 and contacts the redistribution layer 508. The bump structure 515 includes a bond pad 516, a bond bump 518, and a solder ball 520. The bump structure 515 is electrically coupled to the interconnect structure 303 by way of the redistribution layer 508. In some embodiments, the bump structure 515 is configured to electrically couple the IC 500 to another IC (not shown).

Figure 6:
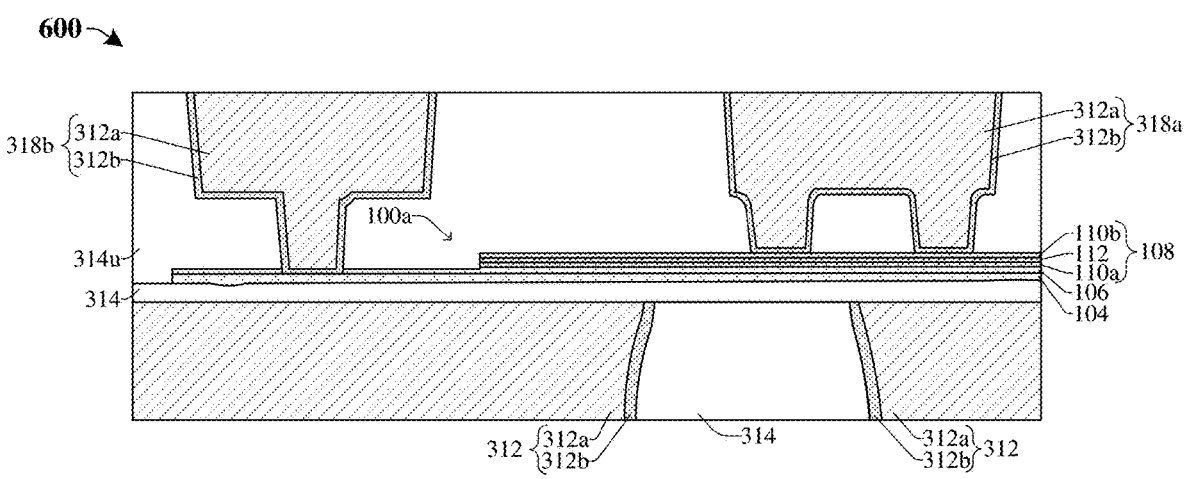
FIG. 6 illustrates a cross-sectional view of some alternative embodiments of a section of the IC of FIG. 5 as indicated by the dashed box in FIG. 5.

Referring to FIG. 6, a cross-sectional view 600 of some alternative embodiments of a portion of the IC 500 of FIG. 5, as indicated by the dashed box in FIG. 5 is provided.

As illustrated in FIG. 6, the MIM capacitor 100*a* is disposed within an ILD layer 314 and overlies conductive wires 312. The conductive wires 312 each comprise a conductive body 312*a* surrounded by a conductive liner 312*b*. A first upper wire 318*a* overlies the top electrode 108 and comprises one or more protrusions that directly contact the top electrode 108. A second upper wire 318*b* overlies the bottom electrode 104, and comprises a protrusion that extends through the capacitor dielectric layer 106 and directly contacts the bottom electrode 104. In some embodiments, the first and second upper wires 318*a*-*b* respectively comprise the conductive body 312*a* surrounded by the conductive liner 312*b*. In some embodiments, the conductive body 312*a* may, for example, be or comprise aluminum, copper, an alloy of the aforementioned, or the like. In further embodiments, the conductive liner 312*b* may, for example, be or comprise tungsten, or the like.

Figure 7:
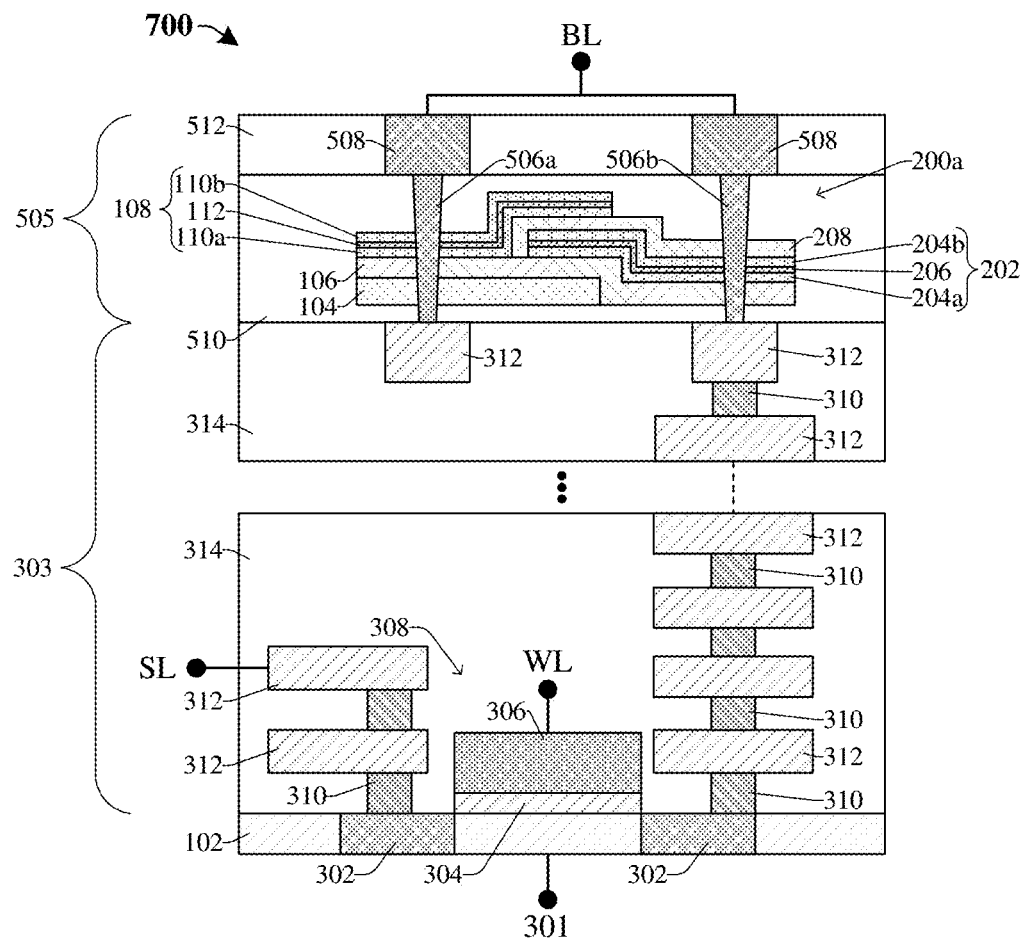
FIG. 7 illustrates a cross-sectional view of an IC including a MIMIM capacitor overlying an interconnect structure.

Referring to FIG. 7, a cross-sectional view of an integrated circuit (IC) 700 corresponding to some alternative embodiments of the IC 300 of FIG. 3 is provided. The IC 700 includes a metal-insulator-metal-insulator-metal (MIMIM) capacitor 200*a* disposed in a first passivation layer 510 and configured for a one-transistor two-capacitor (1T2C) setup.

The access MOSFET 308 is configured and/or illustrated as the access MOSFET 308 of FIG. 3. A bonding structure 505 overlies the interconnect structure 303 and the access MOSFET 308. The bonding structure 505 includes the first passivation layer 510, a second passivation layer 512, a redistribution layer 508, and first and second redistribution vias 506*a*-*b*. The MIMIM capacitor 200*a* is disposed within the first passivation layer 510. The MIMIM capacitor 200*a* includes a bottom electrode 104, a capacitor dielectric layer 106, an upper capacitor dielectric layer 208, a top electrode 108, and a middle electrode 202 disposed between the top and bottom electrodes 108, 104.

The first redistribution via 506*a* extends from the redistribution layer 508 to a topmost layer of the conductive wires 312 in the interconnect structure 303. The first redistribution via 506*a* extends through the top electrode 108, the capacitor dielectric layer 106, and the bottom electrode 104, such that the top electrode 108 is electrically coupled to the bottom electrode 104. The second redistribution via 506*b* extends from the redistribution layer 508 to the topmost layer of the conductive wires 312 and is electrically coupled to a source/drain region 302 of the access MOSFET 308. The second redistribution via 506*b* extends through the upper capacitor dielectric layer 208, the middle electrode 202, and the capacitor dielectric layer 106. Thus, the middle electrode 202 is electrically coupled to the source/drain region 302 of the access MOSFET 308. In some embodiments, the redistribution layer 508 is electrically coupled to the BL.

Figure 8:
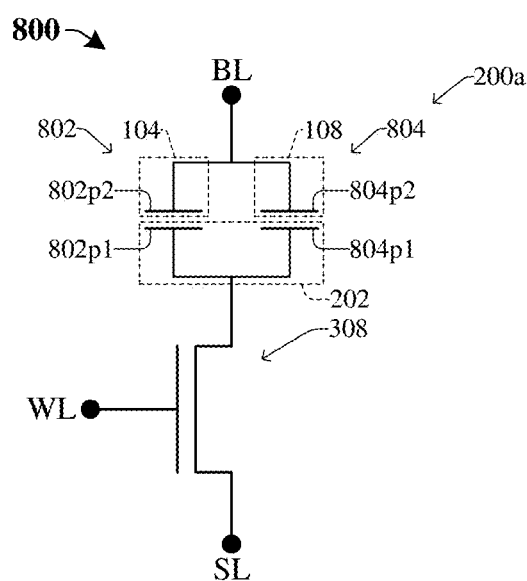
FIG. 8 illustrates a circuit diagram of some embodiments of the IC of FIG. 7.

Referring to FIG. 8, a circuit diagram 800 of some embodiments of the IC 700 of FIG. 7 is provided.

As illustrated in FIG. 8, the SL is electrically coupled to a first source/drain region of the access MOSFET 308. The WL is electrically coupled to a gate electrode of the access MOSFET 308, and a second source/drain region of the access MOSFET 308 is electrically coupled to the MIMIM capacitor 200*a*. The second source/drain region of the access MOSFET 308 is electrically coupled to the BL by way of the MIMIM capacitor 200*a*.

In some embodiments, the MIMIM capacitor 200*a* includes a first capacitor 802 electrically coupled to a second capacitor 804 in parallel with one another. The first capacitor 802 includes a first plate 802*p*1 and a second plate 802*p*2, such that the first plate 802*p*1 is parallel to the second plate 802*p*2. The second capacitor 804 includes a first plate 804*p*1 and a second plate 804*p*2, such that the first plate 804*p*1 is parallel to the second plate 804*p*2. In some embodiments, the middle electrode 202 is configured as the first plate 802*p*1 of the first capacitor 802 and the first plate 804*p*1 of the second capacitor 804. In further embodiments, the bottom electrode 104 is configured as the second plate 802*p*2 of the first capacitor 802, and the top electrode 108 is configured as the second plate 804*p*2 of the second capacitor 804. The second plate 802*p*2 of the first capacitor 802 and the second plate 804*p*2 of the second capacitor 804 are electrically coupled to the BL.

Figure 9:
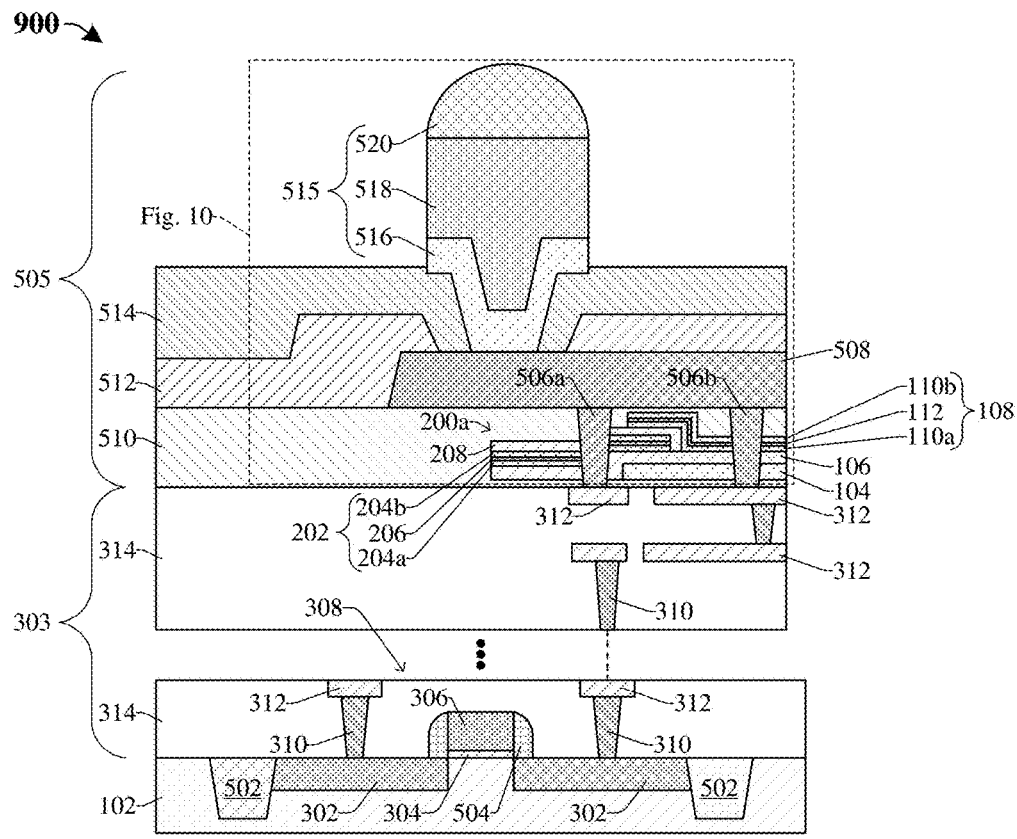
FIG. 9 illustrates a cross-sectional view of some alternative embodiments of the IC of FIG. 7, in which a bonding structure overlies the MIMIM capacitor.

Referring to FIG. 9, a cross-sectional view of an IC 900 according to some alternative embodiments of the IC 700 of FIG. 7 is provided, in which a bonding structure 505 having a bump structure 515 overlies the interconnect structure 303.

The access MOSFET 308 includes source/drain regions 302, a gate electrode 306, and a gate dielectric 304. The source/drain regions 302 are disposed between an isolation structure 502 that extends from an upper surface of the substrate 102 to a point below the upper surface of the substrate 102. In some embodiments, the isolation structure 502 is configured as a shallow trench isolation (STI) structure and comprises one or more dielectric materials (e.g., silicon dioxide). The access MOSFET 308 further includes a sidewall spacer structure 504 surrounding the gate electrode 306 and the gate dielectric 304. At least a portion of the sidewall spacer structure 504 overlies the source/drain regions 302.

The bonding structure 505 overlies the interconnect structure 303 and the access MOSFET 308. The bonding structure 505 includes a first passivation layer 510, a second passivation layer 512, a top dielectric structure 514, the bump structure 515, a redistribution layer 508, and first and second redistribution vias 506a, 506b. The redistribution layer 508 is disposed within the second passivation layer 512. The first and second redistribution vias 506a-b are disposed within the first passivation layer 510 and extend from the redistribution layer 508 to the conductive wires 312. In some embodiments, the redistribution layer 508 is electrically coupled to the MIMIM capacitor 200a. The bump structure 515 extends through the top dielectric structure 514 and contacts the redistribution layer 508. The bump structure 515 includes a bond pad 516, a bond bump 518, and a solder ball 520. The bump structure 515 is electrically coupled to the interconnect structure 303 by way of the redistribution layer 508. In some embodiments, the bump structure 515 is configured to electrically couple the IC 900 to another IC (not shown).

Figure 10:
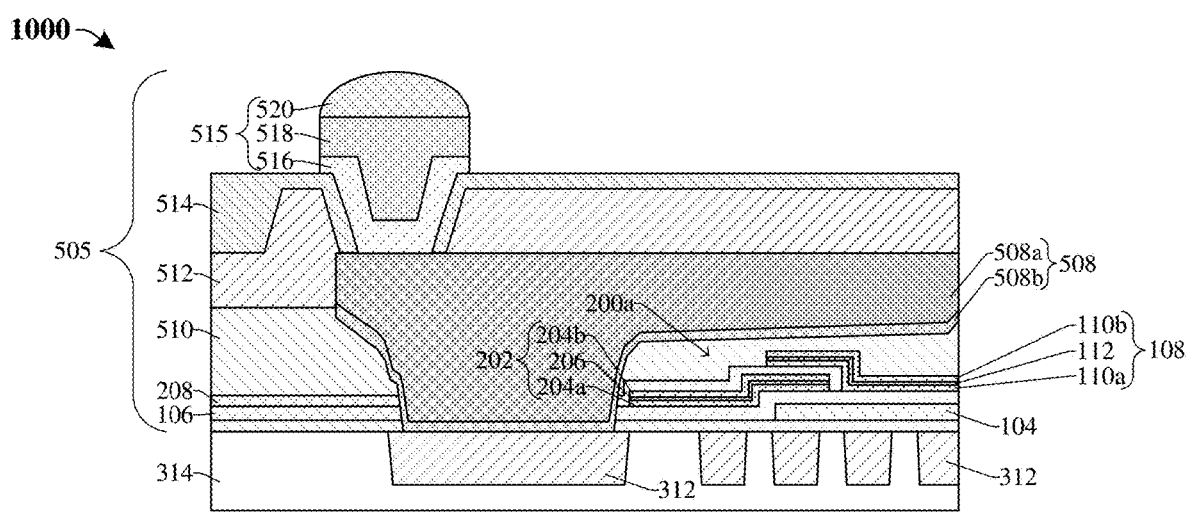
FIG. 10 illustrates a cross-sectional view of some alternative embodiments of a section of the IC of FIG. 9 as indicated by the dashed box in FIG. 9.

Referring to FIG. 10, a cross-sectional view 1000 of some alternative embodiments of a portion of the IC 900 of FIG. 9, as indicated by the dashed box in FIG. 9 is provided.

As illustrated in FIG. 10, the MIMIM capacitor 200a is disposed within the first passivation layer 510 and directly underlies the redistribution layer 508. The redistribution layer 508 includes a conductive body 508a surrounded by a conductive liner 508b. In some embodiments, the redistribution layer 508 has a protrusion that extends through the first passivation layer 510 to a conductive wire 312 in an ILD layer 314. In some embodiments, the conductive body 508a may, for example, be or comprise aluminum, copper, an alloy of the aforementioned, or the like. In further embodiments, the conductive liner 508b may, for example, be or comprise tungsten, or the like.

FIGS. 11-16 illustrate cross-sectional views 1100-1600 of some embodiments of a method of forming a metal-insulator-metal (MIM) capacitor having a diffusion barrier layer according to aspects of the present disclosure. Although the cross-sectional views 1100-1600 shown in FIGS. 11-16 are described with reference to a method, it will be appreciated that the structures shown in FIGS. 11-16 are not limited to the method but rather may stand alone separate of the method. Furthermore, although FIGS. 11-16 are described as a series of acts, it will be appreciated that these acts are not limiting in that the order of the acts can be altered in other embodiments, some acts that are illustrated and/or described may be omitted in whole or in part. In some embodiments, FIGS. 11-16 may, for example, be employed to form some embodiments of the MIM capacitor 100b of FIG. 1B.

Figure 11:
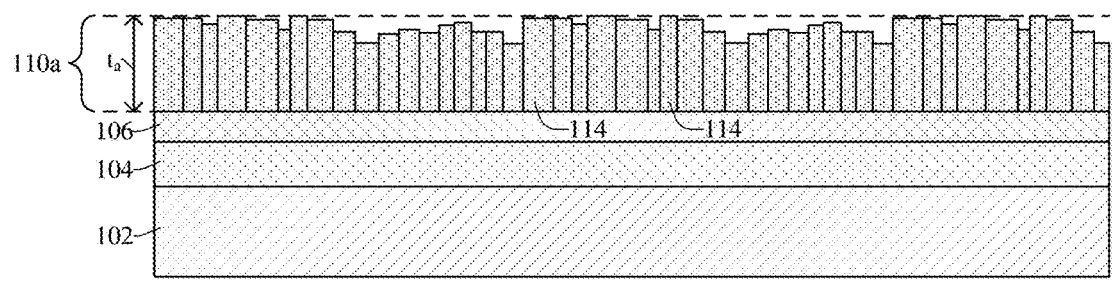
FIGS. 11-16 illustrate a series of cross-sectional views of some embodiments of a method for forming a metal-insulator-metal (MIM) capacitor having a diffusion barrier layer.

As shown in cross-sectional view 1100 of FIG. 11, a bottom electrode 104 is formed over a substrate 102. In some embodiments, the bottom electrode 104 may, for example, be or comprise titanium nitride, tantalum nitride, titanium, tantalum, tungsten, or the like. A capacitor dielectric layer 106 is formed over the bottom electrode 104. A first deposition process is performed to form a first top electrode layer 110a over the capacitor dielectric layer 106. In some embodiments, the first top electrode layer 110a may be a first material (e.g., titanium nitride (TiN)) and/or may have a thickness $t_a$ within a range of about 100 to 200 Angstroms. In some embodiments, the first deposition process includes performing a physical vapor deposition (PVD), such that the first top electrode layer 110a has a plurality of grains 114 (as illustrated and described in FIG. 1B). Other deposition processes are, however, amenable. For example, in some embodiments, the first top electrode layer 110a may be formed by chemical vapor deposition (CVD), atomic layer deposition (ALD), or some other suitable deposition process. The grains 114 may, for example, be columnar grains with grain boundaries that extend from a top surface of the capacitor dielectric layer 106 to a point above the top surface of the capacitor dielectric layer 106. In some embodiments, the thickness $t_a$ is a maximum thickness of the first top electrode layer 110a. In some embodiments, the bottom electrode 104 and/or the capacitor dielectric layer 106 may be deposited by thermal oxidation, CVD, PVD, ALD, some other deposition process, or any combination of the foregoing.

Figure 12:
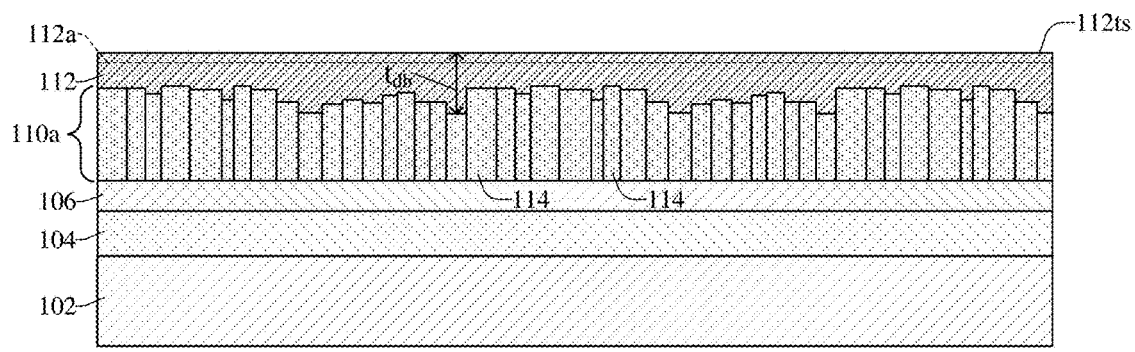

As shown in cross-sectional view 1200 of FIG. 12, a diffusion barrier layer 112 is formed over the first top electrode layer 110a. In some embodiments, the diffusion barrier layer 112 may, for example, be or comprise the first material (e.g., TiN) and/or may have a thickness $t_{db}$ within a range of about 10 to 15 Angstroms. In some embodiments, the thickness $t_{db}$ is a maximum thickness of the diffusion barrier layer 112. In some embodiments, a process for forming the diffusion barrier layer 112 includes: 1) performing a second deposition process to deposit the diffusion barrier layer 112; and 2) performing an annealing process on the diffusion barrier layer 112. In some embodiments, the annealing process may increase from a minimum annealing temperature (e.g. about 250 degrees Celsius) to a maximum annealing temperature (e.g., about 400 degrees Celsius). In some embodiments, the second deposition process includes performing an ALD process, such that the thickness $t_{db}$ may be formed within the range of about 10 to 15 Angstroms. Other deposition processes are, however, amenable. In some embodiments, the diffusion barrier layer 112 and the first top electrode layer 110a are deposited by different deposition processes. For example, in such embodiments, the diffusion barrier layer 112 is deposited by ALD and the first told electrode layer 110a is deposited by PVD. In further embodiments, the diffusion barrier layer 112 may be formed by CVD, PVD, or some other suitable deposition process.

In some embodiments, while performing the annealing process, the structure of FIG. 12 is exposed to a treatment species (e.g., nitrogen ($N_2$), hydrogen ($H_2$), a combination of the foregoing, etc.), wherein the diffusion barrier layer 112 is rich in the treatment species (e.g., N-rich) after performing the annealing process. In some embodiments, during the annealing process the treatment species may be implanted and/or absorbed into the diffusion barrier layer 112, wherein the diffusion barrier layer 112 is rich in the treatment species (e.g., N-rich). In some embodiments, the diffusion barrier layer 112 comprises a ratio of titanium to nitrogen of about 1:1.02, 1:1.03, 1:1.04, or 1:1.05. For example, for every 100 titanium atoms, the diffusion barrier layer 112 may comprise 102 to 105 nitrogen atoms. Further, nitrogen atoms have a smaller atomic radius than titanium atoms, wherein a layer with a greater number of nitrogen atoms than titanium atoms will have a shorter distance between adjacent atoms (i.e., smaller grain sizes). Because the diffusion barrier layer 112 is N-rich (i.e., a greater number of nitrogen atoms than titanium atoms) a distance between atoms in the diffusion barrier layer 112 is less than a distance between atoms in the first top electrode layer 110a. Therefore, the atoms in the diffusion barrier layer 112 are more densely packed together than the atoms in the first top electrode layer 110a, leading to the diffusion barrier layer 112 having smaller grain sizes. In further embodiments, the atoms in the diffusion barrier layer 112 are so densely packed together that a diffusive species is unable to travel between adjacent atoms in the diffusion barrier layer 112.

In further embodiments, the diffusion barrier layer 112 may be N-rich in an upper region 112a, where the upper region 112a is defined from the dotted line in FIG. 12 to a top surface 112ts of the diffusion barrier layer 112. In some embodiments, after performing the annealing process and exposing the diffusion barrier layer 112 to the treatment species, the diffusion barrier layer 112 has at least a partially crystalline structure that is different from that of the first top electrode layer 110a. For example, the diffusion barrier layer 112 has a plurality of grains that are non-columnar and smaller than the grains 114 of the first top electrode layer 110a. In some embodiments, the grains of the diffusion barrier layer 112 may be equiaxed as described and/or illustrated in FIG. 1B. In further embodiments, the annealing process with the treatment species facilitates the partially crystalline structure of the diffusion barrier layer 112, such that the diffusion barrier layer 112 has grains with grain sizes less than about 3 Angstroms. The partially crystalline structure, non-columnar grain sizes, and/or N-rich properties of the diffusion barrier layer 112 block and/or mitigate diffusion of a diffusive species through the diffusion barrier layer 112 during subsequent processing steps (e.g., the patterning, removal, and/or cleaning processes of FIGS. 15 and 16). This, in part, may be because the nitrogen atoms disposed in the diffusion barrier layer 112 during the annealing process reduce a distance between adjacent titanium and nitrogen atoms. Thus, the diffusive species is unable to travel between adjacent titanium and nitrogen atoms in the diffusion barrier layer 112. The diffusive species may, for example, be or comprise oxygen ($O_2$), hydrogen peroxide ($H_2O_2$), hydrofluoric acid (HF), dihydrofolic acid (DHF), or a combination of the aforementioned.

Figure 13:
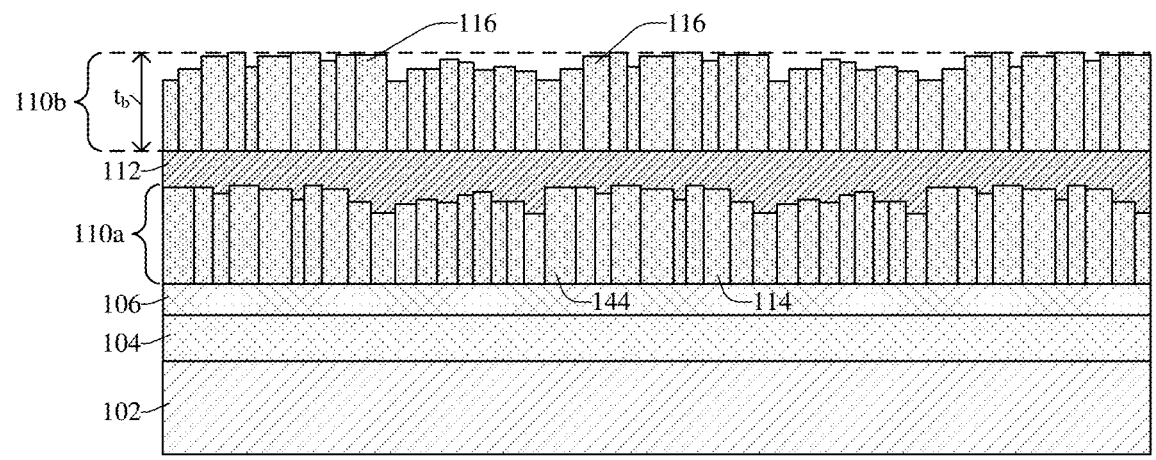

As shown in cross-sectional view 1300 of FIG. 13, a second top electrode layer 110b is formed over the diffusion barrier layer 112. In some embodiments, the second top electrode layer 110b is formed by a third deposition process (e.g., a PVD process), such that the second top electrode layer 110b comprises the first material (e.g., TiN) and/or has a thickness $t_b$ within a range of about 100 to 200 Angstroms. The second top electrode layer 110b has a plurality of grains 116 that may, for example, be columnar grains (as illustrated and described in FIG. 1B). In some embodiments, the third deposition process is the same as the first deposition process (e.g., PVD process) and different from the second deposition process (e.g., ALD process). In further embodiments, the first, second, and third deposition processes each comprise a PVD process. Other deposition processes are, however, amenable for the first, second, and third deposition processes.

Figure 14:
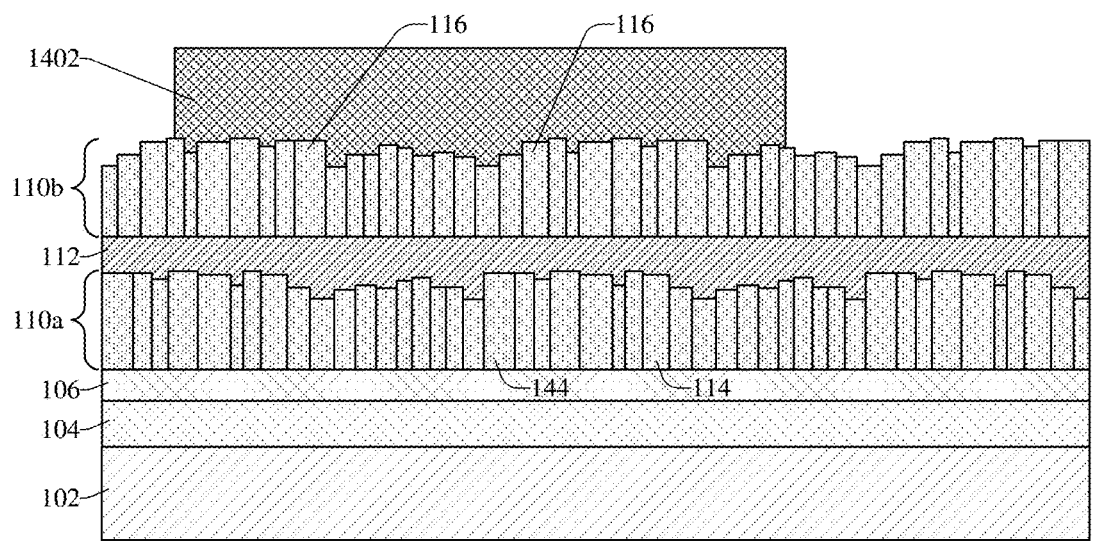

As shown in cross-sectional view 1400 of FIG. 14, a masking layer 1402 is formed over the second top electrode layer 110b. In some embodiments, the masking layer 1402 may, for example, be or comprise a photoresist, a hard mask, or the like.

Figure 15:
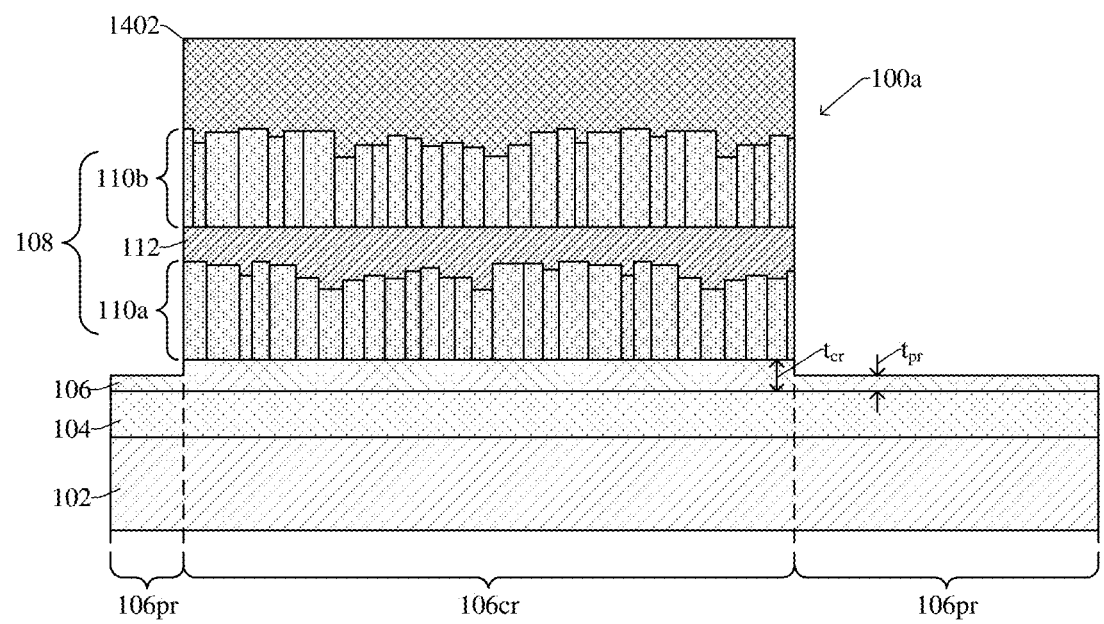

As shown in cross-sectional view 1500 of FIG. 15, a patterning process is performed on the first and second top electrode layers 110a-b, the diffusion barrier layer 112, and the capacitor dielectric layer 106, thereby defining the top electrode 108 and the metal-insulator-metal (MIM) capacitor 100a. The top electrode 108 includes the first and second top electrode layers 110a-b and the diffusion barrier layer 112. The MIM capacitor 100a includes the top electrode 108, the bottom electrode 104, and a capacitor dielectric layer 106. In some embodiments, the patterning process may include performing a wet etch on the first and second top electrode layers 110a-b, the diffusion barrier layer 112, and the capacitor dielectric layer 106. The aforementioned layers may be exposed to one or more etchants according to the masking layer 1402. In some embodiments, the one or more etchants may, for example, be or comprise at least one of the diffusive species (e.g., hydrogen peroxide ($H_2O_2$)).

In further embodiments, after performing the patterning process, the capacitor dielectric layer 106 has a thickness $t_{cr}$ defined in a center region 106cr of the capacitor dielectric layer 106 and a thickness $t_{pr}$ defined in a peripheral region 106pr of the capacitor dielectric layer 106. The top electrode 108 overlies the center region 106cr of the capacitor dielectric layer 106, such that the capacitor dielectric layer 106 has the thickness $t_c$, between a top surface of the bottom electrode 104 and a bottom surface of the first top electrode layer 110a. The peripheral region 106pr surrounds the center region 106cr and is laterally offset from the top electrode 108. In some embodiments, the thickness $t_{pr}$ is less than the thickness $t_{cr}$. Thus, the capacitor dielectric layer 106 has two discrete thicknesses.

Figure 16:
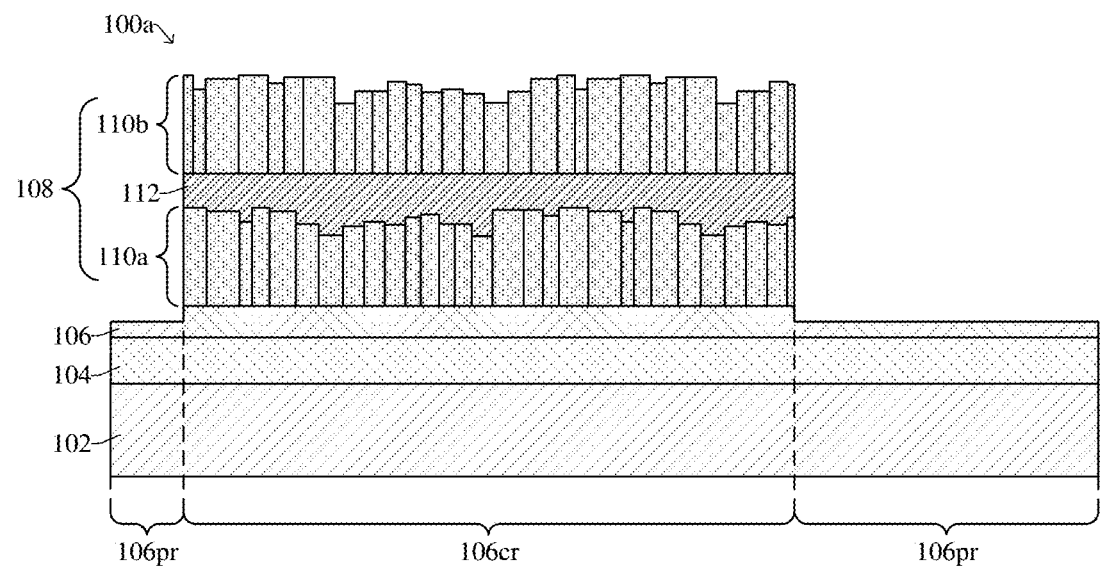

As shown in cross-sectional view 1600 of FIG. 16, a removal process is performed on the structure of FIG. 15 to remove the masking layer (1402 of FIG. 15). In some embodiments, the removal process includes performing a wet etch and/or a dry etch, such as a wet ash and/or a dry ash. The removal process may, for example, include exposing the top electrode 108, masking layer (1402 of FIG. 15), and or the capacitor dielectric layer to at least one of the diffusive species.

In some embodiments, after performing the removal process, a cleaning process may be performed on the top electrode 108 and the capacitor dielectric layer 106 to, for example, remove by-products from the patterning process and/or the removal process. The cleaning process may include exposing the top electrode 108 and the capacitor dielectric layer 106 to at least one of the diffusive species (e.g., $H_2O_2$ and/or dihydrofolic acid (DHF)). The diffusion barrier layer 112 is configured to block diffusion of the diffusive species to the center region 106cr of the capacitor dielectric layer 106 during and/or after the patterning, cleaning, and/or removal process(es), thereby preventing and/or mitigating a formation of voids in at least the center region 106cr of the capacitor dielectric layer 106. This, in part, prevents the breakdown of the MIM capacitor 100a at high operating volts, thereby increasing an operating voltage, an endurance, and a reliability of the MIM capacitor 100a.

Figure 17:
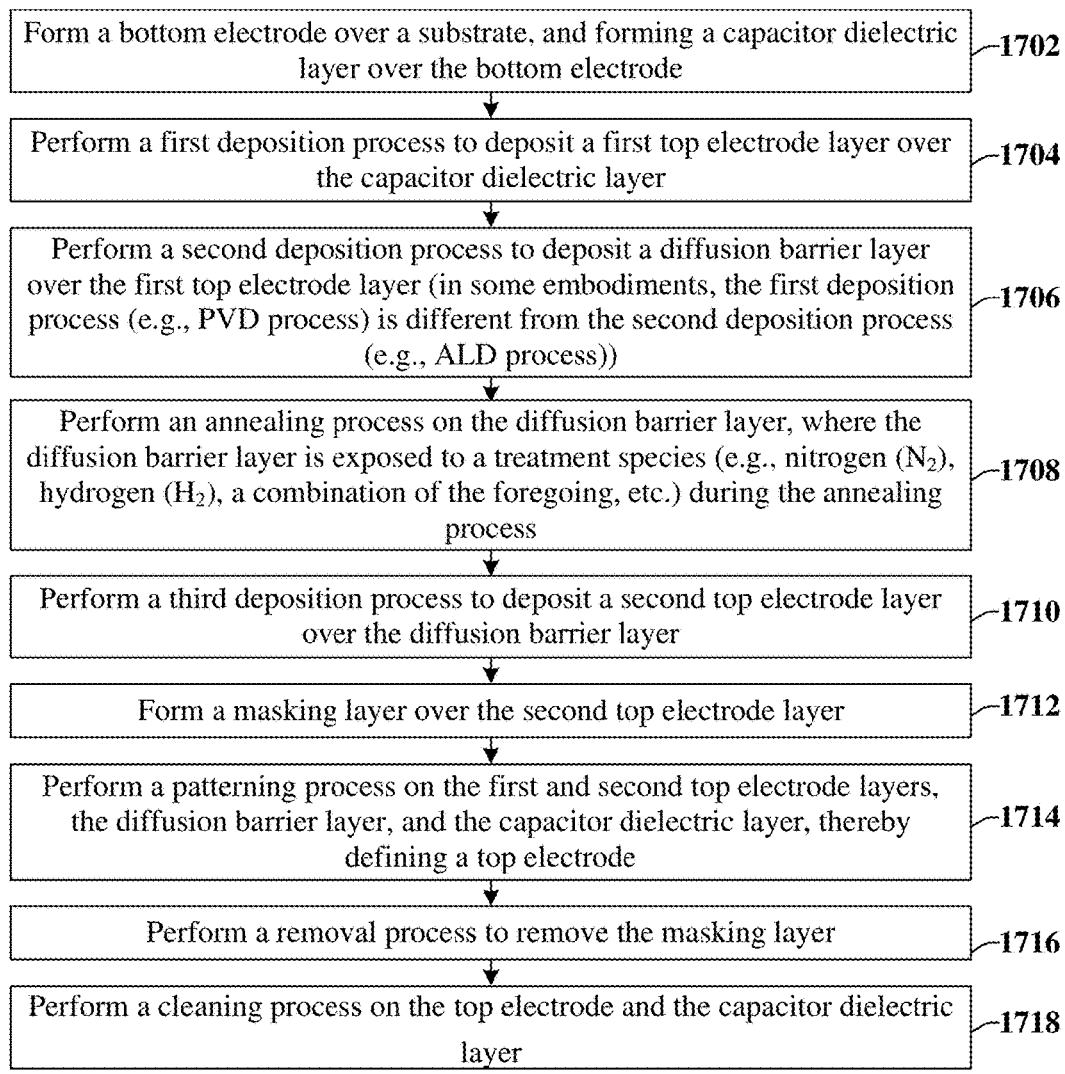
FIG. 17 illustrates a block diagram of some embodiments of the method of FIGS. 11-16.

FIG. 17 illustrates a method 1700 of forming a MIM capacitor having a diffusion barrier layer according to the present disclosure. Although the method 1700 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1702, a bottom electrode is formed over a substrate, and a capacitor dielectric layer is formed over the bottom electrode. FIG. 11 illustrates a cross-sectional view 1100 corresponding to some embodiments of act 1702.

At act 1704, a first deposition process is performed to deposit a first top electrode layer over the capacitor dielectric layer. FIG. 11 illustrates a cross-sectional view 1100 corresponding to some embodiments of act 1704.

At act 1706, a second deposition process is performed to deposit a diffusion barrier layer over the first top electrode layer. In some embodiments, the first deposition process (e.g., a PVD process) is different from the second deposition process (e.g., an ALD process). FIG. 12 illustrates a cross-sectional view 1200 corresponding to some embodiments of act 1706.

At act 1708, an annealing process is performed on the diffusion barrier layer. The diffusion barrier layer is exposed to a treatment species (e.g., nitrogen ($N_2$), hydrogen ($H_2$), a combination of the foregoing, etc.) during the annealing process. FIG. 12 illustrates a cross-sectional view 1200 corresponding to some embodiments of act 1708.

At act 1710, a third deposition process is performed to deposit a second top electrode layer over the diffusion barrier layer. FIG. 13 illustrates a cross-sectional view 1300 corresponding to some embodiments of act 1710.

At act 1712, a masking layer is formed over the second top electrode layer. FIG. 14 illustrates a cross-sectional view 1400 corresponding to some embodiments of act 1712.

At act 1714, a patterning process is performed on the first and second top electrode layers, the diffusion barrier layer, and the capacitor dielectric layer, thereby defining a top electrode. FIG. 15 illustrates a cross-sectional view 1500 corresponding to some embodiments of act 1714.

At act 1716, a removal process is performed to remove the masking layer. FIG. 16 illustrates a cross-sectional view 1600 corresponding to some embodiments of act 1716.

At act 1718, a cleaning process is performed on the top electrode and the capacitor dielectric layer. FIG. 16 illustrates a cross-sectional view 1600 corresponding to some embodiments of act 1718.

Accordingly, in some embodiments, the present disclosure relates to a MIM capacitor that has a top electrode, a bottom electrode, and a capacitor dielectric layer disposed between the top and bottom electrodes. The top electrode has a first top electrode layer, a second top electrode layer, and a diffusion barrier layer disposed between the first and second top electrode layers.

In some embodiments, the present application provides a metal-insulator-metal (MIM) capacitor, including a bottom electrode overlying a substrate; a capacitor dielectric layer overlying the bottom electrode; and a top electrode overlying the capacitor dielectric layer, wherein the top electrode includes a first top electrode layer, a second top electrode layer, and a diffusion barrier layer disposed between the first and second top electrode layers.

In some embodiments, the present application provides an integrated chip, including an interconnect structure overlying a substrate, wherein the interconnect structure includes an alternating stack of conductive vias and wires; a bottom electrode overlying at least one of the conductive wires; a capacitor dielectric layer overlying the bottom electrode; a top electrode overlying the capacitor dielectric layer, wherein the top electrode includes a first top electrode layer; and a second top electrode layer overlying the first top electrode layer, wherein the first and second top electrode layers respectively have a first columnar grain and a second columnar grain, wherein the second columnar grain overlies the first columnar grain and has sidewalls laterally offset from sidewalls of the first columnar grain.

In some embodiments, the present application provides a method for forming a metal-insulator-metal (MIM) capacitor, the method includes forming a bottom electrode over a substrate; forming a capacitor dielectric layer over the bottom electrode; depositing a first top electrode layer over the capacitor dielectric layer; depositing a diffusion barrier layer over the first top electrode layer; performing an annealing process on the diffusion barrier layer, wherein after the annealing process the diffusion barrier layer is rich in a treatment species; and depositing a second top electrode layer over the diffusion barrier layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip, comprising:
forming a bottom electrode over a substrate;
forming a dielectric layer on the bottom electrode;
depositing a first top electrode layer on the dielectric layer by a first deposition process;
depositing a diffusion barrier layer on the first top electrode layer by a second deposition process different from the first deposition process; and
depositing a second top electrode layer on the diffusion barrier layer by a third deposition process, wherein the third deposition process is the same as the first deposition process, wherein the second top electrode layer comprises a plurality of first grain boundaries continuously extending upward from an upper surface of the diffusion barrier layer in a first direction, wherein the diffusion barrier layer comprises a plurality of second grain boundaries vertically stacked over one another and extending in a second direction that is approximately orthogonal to the first direction, and wherein an outermost sidewall of the second top electrode layer is laterally spaced from an outermost sidewall of the diffusion barrier layer such that the diffusion barrier layer extends past the outermost sidewall of the second top electrode layer.

2. The method of claim 1, wherein the first and third deposition processes comprise a physical vapor deposition process and the second deposition process comprises an atomic layer deposition process.

3. The method of claim 1, wherein the first top electrode layer and the second top electrode layer respectively have a thickness within a range of about 100 to 200 Angstroms, wherein a thickness of the diffusion barrier layer is within a range of about 10 to 15 Angstroms.

4. The method of claim 1, wherein the first grain boundaries are approximately straight and the second grain boundaries are jagged.

5. The method of claim 1, further comprising:
performing an annealing process after the second deposition process and before the third deposition process, wherein the diffusion barrier layer is exposed to a treatment species during the annealing process such that the diffusion barrier layer is N-rich.

6. The method of claim 5, wherein the diffusion barrier layer comprises a high concentration of nitrogen in an upper region of the diffusion barrier layer, wherein the upper region is defined from a point disposed above a top surface of the first top electrode layer, wherein a height of the upper region is less than a distance between the top surface of the first top electrode layer and the point.

7. The method of claim 5, wherein a temperature of the annealing process increases from about 250 degrees Celsius to about 400 degrees Celsius.

8. The method of claim 1, further comprising:
performing a wet etch process on the first top electrode layer, the diffusion barrier layer, and the second top electrode layer; and
performing a cleaning process on the first and second top electrode layers, wherein the diffusion barrier layer is configured to block diffusion of one or more diffusive species to the dielectric layer during the wet etch process and the cleaning process.

9. The method of claim 8, wherein the one or more diffusive species comprises hydrogen peroxide, dihydrofolic acid, and/or hydrofluoric acid.

10. A method for forming an integrated chip, comprising:
forming a capacitor dielectric layer over a bottom electrode;
depositing a first top electrode layer over the capacitor dielectric layer;
depositing a diffusion barrier layer over the first top electrode layer, wherein a lower surface of the diffusion barrier layer comprises a plurality of protrusions extending below a topmost surface of the first top electrode layer, wherein the plurality of protrusions contact the first top electrode layer and have different heights from one another;
performing an annealing process on the diffusion barrier layer, wherein after the annealing process the diffusion barrier layer is rich in a treatment species; and
depositing a second top electrode layer over the diffusion barrier layer.

11. The method of claim 10, wherein the first and second top electrode layers are respectively deposited by a physical vapor deposition process and the diffusion barrier layer is deposited by an atomic layer deposition process.

12. The method of claim 10, wherein during the annealing process the diffusion barrier layer is exposed to the treatment species.

13. The method of claim 12, wherein the treatment species comprises nitrogen and the diffusion barrier layer is N-rich.

14. The method of claim 10, wherein the first top electrode layer comprises a planar bottom surface and a plurality of flat upper surfaces vertically offset from one another.

15. The method of claim 10, wherein the diffusion barrier layer comprises a metal nitride, wherein after the annealing process a first concentration of nitrogen in the diffusion barrier layer along a lower surface of the diffusion barrier layer is less than a second concentration of nitrogen in the diffusion barrier layer along an upper surface of the diffusion barrier layer.

16. The method of claim 10, wherein the first top electrode layer comprises a metal nitride having first grain sizes and the diffusion barrier layer comprises the metal nitride having second grain sizes smaller than the first grain sizes, wherein the second grain sizes are less than about 3 Angstroms.

17. A method for forming an integrated chip, comprising:
forming a capacitor dielectric layer over a bottom electrode;
depositing a first top electrode layer over the capacitor dielectric layer by a first deposition process, wherein the first top electrode layer comprises a metal nitride with columnar grains, wherein the first top electrode layer is deposited with a planar bottom surface and an upper surface comprising a plurality of staggered surfaces;
depositing a diffusion barrier layer over the first top electrode layer by a second deposition process different than the first deposition process, wherein the diffusion barrier layer comprises the metal nitride, wherein the diffusion barrier layer directly contacts a sidewall of an individual columnar grain in the first top electrode layer at a location below a top surface of the individual columnar grain;
performing an annealing process on the diffusion barrier layer while exposing the diffusion barrier layer to nitrogen, wherein after the annealing process the metal nitride of the diffusion barrier layer is N-rich and has non-columnar grains, wherein a height of a smallest columnar grain in the first top electrode layer is greater than a height of the non-columnar grains; and
depositing a second top electrode layer over the diffusion barrier layer with a third deposition process that is the same as the first deposition process.

18. The method of claim 17, further comprising:
performing an ashing process on the second top electrode layer, wherein the diffusion barrier layer is configured to prevent diffusion of a diffusive species to the capacitor dielectric layer during the ashing process.

19. The method of claim 17, wherein the plurality of staggered surfaces are substantially flat.

20. The method of claim 17, wherein the second top electrode layer is deposited with an upper surface having a plurality of flat staggered surfaces.

* * * * *